United States Patent [19]

Tahon et al.

[11] Patent Number: 6,120,907
[45] Date of Patent: Sep. 19, 2000

[54] DATA CARD COMPRISING A LASER RECORDING MEDIUM AND A THIN GLASS LAYER

[75] Inventors: Jean-Pierre Tahon, Leuven; Bart Verlinden, Boutersem; Leo Vermeulen, Herenthout; Herman Van Gorp, Tielen, all of Belgium

[73] Assignee: Agfa-Gevaert, N.V., Morstel, Belgium

[21] Appl. No.: 09/177,505

[22] Filed: Oct. 23, 1998

[30] Foreign Application Priority Data

Oct. 24, 1997 [EP] European Pat. Off. ............. 97203312
Sep. 9, 1998 [EP] European Pat. Off. .. PCT/EP98/05748
Sep. 22, 1998 [EP] European Pat. Off. ............. 98203173

[51] Int. Cl.[7] ....................................................... B32B 3/00
[52] U.S. Cl. .......................... 428/426; 428/432; 428/433; 428/913; 430/270.12; 430/495.1; 430/945; 369/283; 369/288
[58] Field of Search ..................................... 428/426, 432, 428/433, 688, 689, 913, 64.1, 64.4; 430/270.12, 495.1, 945; 369/283, 288

[56] References Cited

FOREIGN PATENT DOCUMENTS 63-074136  4/1988  Japan .
63-074137  4/1988  Japan .

*Primary Examiner*—Elizabeth Evans
*Attorney, Agent, or Firm*—Breiner & Breiner

[57] ABSTRACT

According to the present invention a data card is provided which comprises a heat-mode laser recording medium on a support and wherein said laser recorder medium is covered by a thin flexible glass layer. The data card has a higher mechanical strength, an improved shelf-life and offers better security with regard to counterfeiting. The heat-mode laser recording medium is preferably a metal layer of which the optical reflectivity or density can be changed by laser exposure. The glass layer is preferably a borosilicate glass having a thickness less than 850 $\mu$m.

10 Claims, No Drawings

DATA CARD COMPRISING A LASER RECORDING MEDIUM AND A THIN GLASS LAYER

FIELD OF THE INVENTION

The present invention relates to data cards which can store information by laser recording.

BACKGROUND OF THE INVENTION

Cards which can store information are widely used for various applications. Cards comprising a magnetic strip are well known but also other types, such as laser-recordable cards or cards comprising an electronic chip, sometimes called 'smart cards', are becoming increasingly popular.

Dil, in U.S. Pat. No. 4,209,804 teaches a reflective information recording structure which contains prepressed V-shaped grooves in Which data may be recorded by a laser causing local melting of the reflective metal coating. The data on the media is read by means of optical phase shift effects. Since the preformed grooves are at an optical phase depth of 950 to 1400, the reading laser must be of the precise wavelength corresponding to the groove depth. The information area has a width, depending on the wavelength of the recording beam, of 0.4 to 0.8 $\mu$m and a thick protective substrate, usually 1200 $\mu$m deep, is used to ensure that small dust particles are out-of-focus for the read beam.

Such thick protective materials cannot be used for wallet cards which have a total thickness of only 800 $\mu$m under ISO standards. In addition, it would be uncomfortable to carry a thick, rigid card in trousers pockets or wallets. It is also difficult to laminate a phase sensitive recording/reading medium to a protective foil with an adhesive without introducing a varying phase shift across the surface. It is also impracticable to melt large holes since a large lip will be formed around the hole causing a great distortion of the phase shift. Edge transition of the hole is the phase shift which is measured, and since the height of the lip is directly proportional to the square root of the hole diameter, phase shift reading is only practical for small holes. For example, a 25 $\mu$m diameter hole creates a lip of one $\mu$m height, which is much larger than the wavelength of the reading beam. Thus for large holes and bonded protective materials it is desirable to have a recording/reading structure that does not rely on phase shifts.

Lahr in U.S. Pat. No. 3,873,813 teaches a debit card wherein a reflective heat sensitive material becomes transparent on heating, thereby exposing an underlying strip of black paper which then absorbs the light energy. Recording requires exposure to a high intensity light beam for 0.7 second to raise the temperature of the material to 80° C. and an additional 5 milliseconds above 80° C. This type of credit card system permits recording of less than two data bits per second. Because of the retained diffused liquid, the sizes of the data spots are large and difficult to control. This card requires a blue read beam, therefore scratches and surface dust may cause a large number of data errors unless very large data spots are used which reduce the capacity to less than 10,000 bits. While this data capacity is sufficient for some debit and credit cards, it is unsuitable for detailed recording of financial, insurance, medical and personal records. Also, the recording rate of less than two bits per second would make it unsuitable for most applications. Another disadvantage of said card is that all the data are destroyed at a temperature above 80° C., for example when lying on the dashboard of a car or if passed through a household washer and dryer.

Nagata in U.S. Pat. No. 4,197,986, Girard in U.S. Pat. No. 4,224,666 and Atalla in U.S. Pat. No. 4,304,990 teach updating of data cards. Nagata teaches the updating of maximum limits and balance on a card in which the complete data file is kept in an auxiliary memory circuit such as a magnetic disc or drum. A sales slip containing the transaction is recorded separately from the card. Girard teaches a data-processing machine-access card containing an integrated circuit chip with a memory bank. The memory stores predetermined items of confidential data intended to authorize or prevent access to the machine. Only the balance is updated. Atalla teaches a card on which only the balance is recorded and updated. This card can only be used where the transaction system is connected to a central computer. None of these cards has the memory storage capacity needed to accumulate records of past transactions.

Drexler in U.S. Pat. No. 4,542,288 teaches a method for making a data card involving photolithographically prerecorded information, such as reference position information or servo tracks, on a strip of a high resolution, direct-read-after-write laser recording material, then adhering the strip to a card such that the strip is recordable in place. A protective transparent laminating material is bonded to the recording surface and then user information is recorded on the strip using a laser which is focused on the strip through the laminating material. This laminating material is preferably polycarbonate which has the disadvantage that it does not adhere well to the recording layer.

A major disadvantage of the prior art laser recording materials is their susceptibility to mechanical impact which may cause defects such as scratches and may result in a considerable loss of the recorded data. In addition, most of these data cards comprise a plastic foil as protective layer on top of the recording medium. The life-time of such recording materials, which is required to be 10 years for some applications, is insufficient because the plastic foil is not an efficient barrier against solvents, oxygen, moisture and other potential causes of data loss.

SUMMARY OF THE INVENTION

It is an object of the present invention to provide a data card which can store information by laser recording and is characterized by a longer shelf-life and less susceptibility to mechanical damage than the prior art materials. This object is realized by a data card comprising a support and a heat-mode laser recording medium, characterized in that said data card further comprises a glass layer having a thickness of less than 850 $\mu$m. Preferred embodiments of the present invention are defined in the dependent claims.

Further advantages of the present invention will become clear from the description hereinafter.

DETAILED DESCRIPTION OF THE INVENTION

The data card of the present invention comprises a support which is provided with a heat-mode recording medium for storing information by laser exposure. The term "support" is used in the meaning of a "self-supporting layer" so as to distinguish it from layers which may be coated on a support but which are not self-supporting. The data card further comprises a thin glass layer as an efficient protection against solvents, oxygen, moisture and other potential causes of data loss. In a highly preferred embodiment, the heat-mode recording medium is sandwiched between the support and the glass layer. In another preferred embodiment, an additional glass layer is present at the opposite side of the support, so as to obtain a data card comprising two glass layers on opposite sides of the support carrying the laser recording medium.

The glass layer, the recording medium and the support preferably form a laminate. The term "laminate" as used herein shall be understood as "a material consisting of a plurality of bonded layers". The layers may be bonded to each other by applying an intermediate adhesive layer between said bonded layers but also vacuum lamination can be used. The recording medium may itself act as an adhesive layer between the support and the glass layer. The laminated glass layer prevents counterfeit of the card or of the data stored on the card because the glass layer is difficult to remove without breakage. The high specific weight of the glass layer is another, easily verifiable safety feature which distinguishes the card from copies made without such a glass layer.

The glass layer is preferably a flexible glass layer, allowing the data card to be bent without breaking. The word flexible as used herein shall be understood as meaning "capable of being wound around a core without breaking". A preferred glass layer used in the card of the present invention is capable of being wound around a cylindrical core having a radius of 1.5 m without breaking. The lower the thickness of the glass, the higher is its flexibility and thus the lower the minimum radius of the core around which the glass can be wound without breaking. The glass layer used in the data card of the present invention has a thickness of less than 850 $\mu$m. For higher flexibility said thickness is preferably less than 500 $\mu$m, and even more preferably between 150 and 300 $\mu$m. The minimum thickness is preferably at least 20 $\mu$m more preferably at least 50 $\mu$m because glass having a lower thickness may be too brittle.

Flexible glass is known in the art. Two basic requirements for obtaining flexible glass are a low thickness and a high strength.

The strength is determined by its composition and manufacturing process. EP-A 716 339 describes a flexible glass substrate having a thickness lower than 1.2 mm, a failure stress (under tensile stress) equal to or higher than $1 \times 10^7$ Pa and an elasticity modulus (Young's modulus) equal to or lower than $1 \times 10^{11}$ Pa. Such glass can be made by squeezing semi-molten glass between metal rollers to produce a thin web.

U.S. Pat. No. 4,388,368 describes another method to produce flexible glass sheets. A soda lime glass ($Na_2O.CaO.SiO_2=15:13:72$ by weight) molten at 1550° C. is drawn and rolled. The glass thus formed is supported by clips at both ends and heated at about 350° C. Thereafter the glass sheet is stretched to from 1.05 to 10 times the area of the original sheet while blowing hot blast of air at a temperature lower than the aforesaid heating temperature onto the glass sheet, e.g. about 700° C. By stretching the glass sheet while blowing thereon a hot blast of air at a temperature lower than the heating temperature, the glass sheet is cooled faster at thin portions, and thereby the thickness of the glass sheet thus stretched is maintained uniform. A similar method has been described in JP-A 58,095,622. In another method, described in JP-A 58,145,627, a web of molten glass is pulled upward and immediately drawn horizontally using large rollers onto the surface of a molten metal bath, followed by gradual cooling. The glass thus obtained has improved flatness.

Highly preferred glass for use in the present invention is thin borosilicate glass which is considerably stronger than e.g. regular sodium float glass. Borosilicate glass comprises $SiO_2$ and $B_2O_3$. The detailed composition of some borosilicate glass types has been described in e.g. U.S. Pat. Nos. 4,870,034, 4,554,259 and 5,547,904.

Chemically strengthened float glass may also be used in the present invention. Chemically strengthened glass is glass wherein at both surface layers the original alkali ions are at least partially replaced by alkali ions having a larger radius. In chemically hardened sodium lime silica glass, the sodium ions near the surface of the glass are at least partially substituted by potassium and in chemically hardened lithium lime silica glass, the lithium ions near the surface are at least partially substituted by sodium and/or potassium. Known methods for producing chemically strengthened glass are processes wherein glass is exposed to ion exchange conditions as described in e.g. JP-A 56,041,859, GB 1,208,153 and U.S. Pat. No. 3,639,198.

The thickness of the chemically strengthened layer is herein defined as the thickness of the layer at the surface of each side of the glass wherein said substitution has taken place for at least 25%. For economical reasons the thickness of the chemically strengthened layer of the glass is preferably less than one quarter of the total thickness of the original glass. In glass having a thickness between 150 and 300 $\mu$m the thickness of the chemically strengthened layer is preferably less than 30 $\mu$m most preferably less than 15 $\mu$m. So the outer part of the glass support is at least partially substituted and the unsubstituted inner part of the glass support is the main part. More details about chemical strengthening of glass are i.a. given in "Glass Technology, Vol. 6, No. 3, page 90–97, June 1965 which therefore is incorporated herein by reference. Preferably said chemical strengthening of the thin glass is executed on-line with the preparation of the float glass.

Flexible, thin glass for use in the present invention is commercially available, e.g. from Pilkington. Corning also supplies thin glass, e.g. types 7059F and 1737F with a thickness of 0.7 mm and 1.1 mm. Thin borosilicate glass is commercially available from Deutsche Spezialglass AG (Desag, Germany), a Schott Group company, e.g. types AF45 and D263 with a thickness ranging from 30 um to 1.1 mm. According to the technical brochure "Alkali Free and Low Alkali Thin Glasses", subtitle "AF45 and D263: Thin Glasses for Electronic Applications", published by Desag in 1995, thin borosilicate glass is available in a thickness of 30 $\mu$m, 50 $\mu$m, 70 $\mu$m, 100 $\mu$m, 145 $\mu$m, 175 $\mu$m 210 $\mu$m 300 $\mu$m, 400 $\mu$m, 550 $\mu$m, 700 $\mu$m, 900 $\mu$m and 1100 $\mu$m.

The glass layer can also be a pre-broken glass layer or a glass layer comprising crack lines as described in European Patent Application No. 98202380, filed on Jul. 15, 1998. Such glass is especially preferred when very high flexibility is required.

Intermediate layers can be present between the laser recording medium and the support or between the glass layer and the laser recording medium, e.g. layers which improve the adhesion. The thin glass layer may be coated with a silicate sol/gel coat having preferably a thickness of at least 1 $\mu$m, more preferably of at least 10 $\mu$m. When the laser recording medium comprises gelatine as a binder, it may be beneficial to add an epoxysilane compound according to the following formula so as to obtain a good adhesion between the gelatine layer and the glass layer:

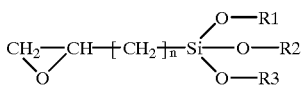

wherein R1, R2 and R3 are hydrogen, an alkyl or a substituted alkyl group and n ranges from 1 to 10, preferable from 1 to 3.

Methods for laminating the glass layer are well known. Layers may be laminated without the use of an adhesive layer by so-called vacuum lamination. In order to obtain an effective bond, the laser recording medium and the support are preferably characterised by a low surface roughness, i.e. they preferably do not contain a so-called spacing agent, which is often introduced in plastic foils or in coatings on foils to prevent sticking. In addition to vacuum lamination, the use of double-sided adhesive tape or an adhesive layer, obtained by applying e.g. a hot-melt or a latex followed by the application of heat or pressure, is highly preferred. Said latex is e.g. polyurethane, polyethylene, poly(methyl acrylate) or ethylene-vinyl acetate. Alternatively a slightly moistened gelatine layer can also be used as 2- adhesive layer. The adhesive layer may further be a temperature-sensitive adhesive layer, a pressure-sensitive adhesive layer or an adhesive that is curable by ultraviolet radiation, by exposure to an electron beam or which is thermally curable.

The adhesive layer may be applied either to the glass, to the support, or to both and may be protected by a stripping layer, which is removed just before lamination. The bond between the glass and the support is preferably permanent so that they cannot be separated without destroying the information which can be stored in the laser recording medium.

Lamination of the glass layer and the support can be effected manually but preferably is effected in a laminating means called a laminator. A typical laminator comprises a pair of heatable rollers, having an adjustable pressure and moving at a fixed or an adjustable speed. The lamination is carried out by bringing the materials in close contact with each other between the rollers of the laminator, optionally after applying an adhesive layer between said materials.

The support has preferentially a thickness between 5 $\mu$m and 850 $\mu$m, more preferably between 100 $\mu$m and 600 $\mu$m. The support can be paper or metal but is preferably a plastic foil e.g. cellulose acetate film, poly(vinyl acetal) film, polystyrene film, polycarbonate film, polyethylene terephthalate) film, polyethylene film, polypropylene film, or copolymers thereof, e.g. a copolymer of acrylonitrile, styrene and butadiene. The support is preferably a transparent material. The glass layers discussed above can also be used as support. So a preferred embodiment of the data card of the present invention comprises, in the order given, a glass layer as support, a heat-mode laser recording medium provided thereon, and a second glass layer covering the recording medium.

On the side of the support opposite to the laser recording medium, there can be another laminated layer. Said laminated layer can be paper, metal, a plastic material or another glass layer. So a preferred embodiment of the data card of the present invention comprises, in the order given, a glass layer laminated to a support, a heat-mode laser recording medium provided on the support, and a second glass layer covering the recording medium.

The laser recording medium of the present invention is a heat-mode recording medium, which means that the data are recorded by the local heating of the medium upon exposure to a laser beam having sufficient power. Said local heating may induce ablation, melting, particle coagulation, decomposition or other (physico-)chemical processes which result in a local change of the optical reflectivity or optical density of the medium so as to obtain recorded data which can be read out by optical means.

In order to increase the optical reflective contrast when e.g. a highly reflective thin metal layer is used as recording medium, a black layer can be applied between the support and the laser recording medium or on the other side of the support, opposite to the recording medium. Said black layer may contain any kind of black dye or pigment, but filamentous silver and carbon black are preferred. In still another embodiment, the performance of a laser recording medium of which the optical density decreases upon heat-mode exposure may be enhanced by the presence of a light reflecting layer between the laser recording medium and the support. An embodiment of such a material is described in the examples.

Various materials which are suitable as a heat-mode recording medium are known in the art. Particularly suitable materials are metal layers. Ablation of metal layers having a relatively high reflectivity can produce recording spots of lower reflectivity. The thickness of the metal layer is preferably not larger than 700 nm and more preferably in the range of 50 to 600 nm. Tellurium and tellurium alloys have been widely used to form highly reflective thin metal films wherein heating by an incident laser beam locally reduces the reflectivity by pit formation. Reference is made to e.g. the periodical Physik in unserer Zeit, 15. Jahrg. 1984/Nr. 5, 129–130 the article "Optische Datenspeicher" by Jochen Fricke. Tellurium however is toxic and, therefore, other relatively low melting metals such as Ag, Se, Sn and Bi are preferred as a suitable heat-mode recording medium in the data card of the present invention. A survey of other suitable metals is disclosed in U.S. Pat. No. 4,499,178 and 4,388,400.

According to another embodiment of the present invention an increase in transmission may be obtained in laser beam heated areas of an initially low reflective heat-mode recording medium. Suitable materials for use in the latter embodiment are e.g. mixtures obtained by co-deposition of low melting point metals and sulphides such as GeS or SnS on a transparent support as described e.g. in Journal of Applied Photographic Engineering, Vol. 9, No. 1, February 1983, p. 12. For the production of optical media wherein the information is read in the reflection mode said poor reflective heat-mode recording medium can be applied onto a relatively high melting reflective support or layer, e.g. aluminium layer, carried by a support.

Thin layers of metals, alloys or salts suited for heat-mode recording can be produced by vacuum deposition. In a preferred embodiment of the present invention, a thin vacuum deposited layer of Bi or Ag is used as the recording medium because of its low toxicity, the low energy required for ablation by fusion or evaporation and because these elements form films with ease by vapour deposition. For example, the coating of a bismuth layer by vapour deposition may proceed under reduced pressure in the range of $10^{-2}$ Pa to $8 \times 10^{-1}$ Pa as described in EP-A- 0 384 041.

A thin layer of Ag can also be deposited using so-called diffusion transfer reversal (DTR) processing. The principles of the DTR process have been described e.g. in U.S. Pat. No. 2,352,014 and in the classic reference work "Photographic Silver Halide Diffusion Processes" by Andre Rott and Edith Weyde, The Focal Press, London and New York, (1972). By DTR processing of an information-wise exposed silver halide material, non-developed silver halide present in the photosensitive emulsion layer of the material is transformed with a so-called silver halide solvent into soluble silver complex compounds which are allowed to diffuse into an image receiving element and are reduced therein with a developing agent, generally in the presence of physical development nuclei. Two silver images are thus obtained: a chemically developed negative image in the emulsion layer and a physically developed positive "DTR image" in the nuclei layer. In a preferred embodiment, the nuclei layer is present in the same material as the photosensitive layer, thereby forming a so-called mono-sheet DTR material, though two-sheets embodiments are also known in the art. So when an unexposed DTR material consisting of a support, a silver halide emulsion layer and a thin physical development nuclei layer is subjected to DTR-processing, a uniform silver metal layer is deposited in the nuclei layer. The silver metal layer thus obtained can be used as a heat-mode laser recording medium as will be demonstrated in the examples.

In addition to an ablatable metal the heat-mode recording medium may further comprise substances which increase the recording sensitivity, e.g. by lowering the reflectivity or improving the absorption of laser light. Examples of such substances are the metal oxides, sulphides and halides described in e.g. UK-P- 2 036 597. GeS and SnS are preferred for said purpose and may be applied in a thickness depending on the wavelength of the recording light, e.g. in the range of 5 to 100 nm, as anti-reflection layer without disturbing the ablation of the metal layer.

Other compounds suitable as the laser recording medium may be composite films, whose reflectivity can be reduced by evaporation, thin films of dyes whose reflectivity can be changed by ablation, dielectric materials whose refractive index can be changed, causing scattering of light when scanned with a laser and photochromic layers of dyes such as bacteriorhodopsine. A preferred medium comprising a laser recordable dye is described in U.S. Pat. No. 5,264,327.

The laser recording medium may be present over the whole area of the data card or may be a strip in a part of the data card. The laser recording medium can be applied on one side or on both sides of the support. In another preferred embodiment the laser recording medium is applied in the form of a circular disc. Said embodiment has the advantage that the writing and the reading of information can occur at a much higher speed. When the laser recording medium is in the form of a strip, no continuous writing or reading can be performed because there is always a stop and go when the next track is reached. With an laser recording medium in the form of a circular disc, a high writing and reading speed can be obtained due to a fast rotation of the laser beam or of the data card. Preferably the access time on a track-to-track basis is smaller than 3 milliseconds and the track resolution is smaller than 7 $\mu$m. The centerpoint of the rotation can be situated inside or outside the card and the centering may be done optically by means of a laser or mechanically by means of a hole.

Information can be stored in the recording medium by using a visible light laser such as an Ar or He/Ne laser, a red laser diode, etc., the particular wavelength being selected on the basis of the laser recording medium used. Infra-red lasers are highly preferred because infrared light is affected least by scratches and dirt on the glass layer.

The recording medium has preferably a favourable signal-to-noise ratio, i.e. a high contrast between exposed and unexposed areas, the contrast being defined as the density or reflectivity difference between these areas. Preferably, laser recording is carried out at a speed of at least several thousands bits/s. This generally precludes the use of materials that require long heating times or that rely on slow chemical reactions in the presence of heat, which may permit recording at only a few bits/s.

In reflective type media, the reflectivity of unexposed areas is preferably not less than 50% whereas the reflectivity of a data spot obtained by exposure is preferably less than 10%, thus creating a contrast ratio of greater than five to one. Alternatively data may also be recorded by increasing the reflectivity of the strip. For example the recording laser can melt a field of dull microscopic spikes on the strip to create flat shiny spots. This method is described in SPIE, Vol. 329, Optical Disk Technology (1982) p.202. A spot reflectivity of more than twice the surrounding spiked field reflectivity produces a contrast ratio of at least two to one, which is a sufficient contrast for reading The recording medium is preferably characterised by a high resolution, enabling recorded spots having a size less than 50 $\mu$m, more preferably a size of 5 by 20 $\mu$m or circular spots having a diameter from 5 $\mu$m to 10 $\mu$m. The storage capacity of the laser recording medium is preferably larger than 250,000 bits, and more preferably over one million bits.

The writing laser beam should have sufficient laser pulse energy at the surface of the recording material to create data spots. Typically, 5 to 20 milliwatt is required, depending on the recording material. A 20 milliwatt semiconductor laser, focused to a five micron beam size, may records at temperatures of about 200° C and is capable of creating spots in less than 25 microseconds. In the read mode, power may be lowered to about 5% of the recording power.

The data card may also contain security information which is visually and/or digitally readable on the same side of the laser recording medium or more preferentially on the opposite side of the support. Examples of said security information are: an image, a hologram, a watermark, finger prints, printed patterns known from bank notes, signature or other printed personal data or marks or layers that may be applied with liquid crystals, fluorescent pigments, nacreous pigments giving special light-reflection effects, and/or visibly legible or ultraviolet-legible printing inks as described e.g. in GB-P- 1 518 946 and U.S. Pat. No. 4,105,333. Such security information is difficult to alter because the glass layer cannot be removed without breaking. The security information can be mixed in the same layer or in several layers. The mixing can be carried out by pseudo-random generators using a frequency modulated screen.

Optical information can be partly applied directly on the support or on a layer on the support by printing techniques. Suitable printing processes are e.g. planographic offset printing, gravure printing, intaglio printing, screen printing, flexographic printing, relief printing, tampon printing, ink jet printing, laser printing, thermal transfer printing, dye diffusion thermal transfer printing and toner-transfer printing from electro(photo)graphic recording materials.

Another security feature could be a digital or optical mask. A digital mask can be an algorithm by which the digital data of a coherent signal (image or text) are changed into a broad-band, unreadable pseudo-random signal. An optical mask, acting as an optical encryption medium, can be a spatial phase mask film comprising a patterned array of diffused and not diffused pixels or a phase distorting medium. At the moment of verification, the user needs to enter a pin code to select a complimentary optical or digital mask which decodes the pseudo-random signals so as to restore the coherent signal.

Other information that can be present on the data card comprises a portrait, a radio frequency chip, either contactless or with an antenna, a 1D–2D barcode, a magnetic strip, microlettering, a read-only optical memory or a programmable read-only memory chip.

EXAMPLES

First a mono-sheet DTR imaging element was prepared which consisted of, in the order given, a polyester support, a base layer, a silver halide emulsion layer and a physical development nuclei layer. The polyester support had a thickness of 175 μm and was provided with a double subbing layer to promote the adhesion of the other layers. The base layer and the silver emulsion layer were coated in a single pass using a cascade coating method and after storage during one week the physical development nuclei layer was coated as a top layer thereon using an airknife coating method.

The coating solution of the base layer had a pH of 5.0 and was coated at a wet thickness of 50 μm. The base layer contained the following ingredients:
- 2.84 g/m² of gelatine;
- 0.12 g/m² of a silica matting agent having a diameter between 3.5 and 5.0 μm;
- 0.21 g/m² of another silica matting agent having a diameter between 1.3 and 2.1 um;
- 0.11 g/m² of carbon powder, added as a dispersion in gelatine;
- 2.63 g/m² of titanium dioxide powder, also added as a dispersion in gelatine;
- 0.40 g/m² of dimethylphenidon as a developing agent;
surfactant.

The silver halide emulsion contained cubic crystals, consisting of 78.6 mole % of AgCl, 21.0 mole % AgBr and 0.4 mole % of AgI, which were doped with iridium and rhodium. These crystals were obtained using the well known silver halide precipitation methods by the simultaneous or alternate addition of aqueous solutions of silver nitrate, sodium chloride, potassium bromide and potassium iodide. After precipitation the emulsion was flocculated by the addition of polystyrenesulphonate and lowering of pH to 3.4. The soluble salts were then removed by decantation of the supernatants and washing with water (procedure repeated three times). The silver halide crystals were chemically ripened by adding thiosulphate and a $Au^{3+}$ salt and then digesting during 3.5 hours at 50° C. The silver halide emulsion comprised 185 g/kg of silver halide (expressed as silver nitrate) and 88 g/kg of gelatine and a pH of about 5.2. The silver halide grains had an average diameter of about 0.40 μm.

The above emulsion was coated at a pH of about 4.3, a wet thickness of about 22 μm, a silver coverage of 1.55 g/m² (expressed as silver nitrate) and a gelatine coverage of 1.50 g/m² of gelatine. The emulsion layer further contained the following additional non-gelatine ingredients:

1.68 mg/m² of the following compound as supersensitiser:

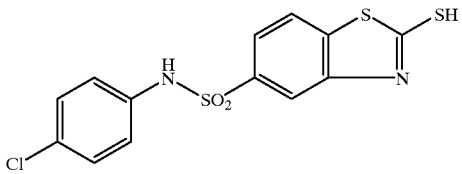

1.34 mg/m² and 0.54 g/m² of the following spectral sensitisers respectively:

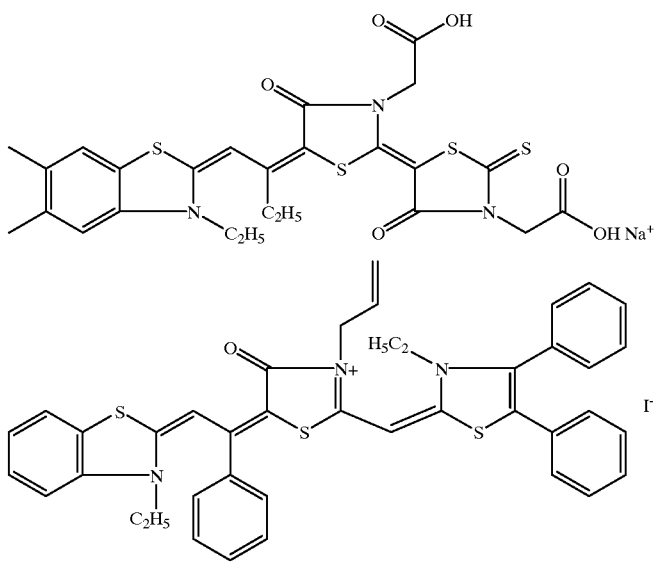

11 mg/m² of the following stabiliser

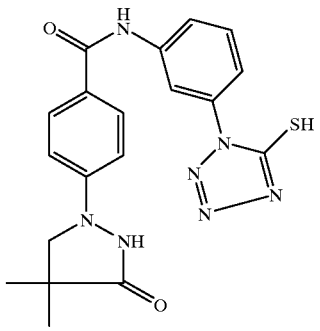

33 mg/M² of an ethylacrylate latex;
240 mg/m² of dimethylphenidone;

196 mg/m² of a silica matting agent having a diameter between 3.5 and 5.0 μm;
226 mg/m² of hydroquinone;
158 mg/m² of formaldehyde;

The physical development nuclei layer contained 0.36 g/m² of hydroquinone, 0.67 g/m² of formaldehyde, 0.66 g/m² of PdS nuclei and surfactants and was coated at a pH of about 8.0 and a wet thickness of about 13 μm.

A strip of the above material was partially exposed through a step-wedge and then processed using standard DTR developer G800 and stabiliser G820 (trade names), available from Agfa-Gevaert N.V., Belgium. In this way a material was obtained which contained two silver layers : in the exposed areas the silver halide crystals were chemically developed to form silver grains in the emulsion layer (the negative image of the step-wedge) and in the unexposed areas finely divided silver grains were formed on the physical development nuclei layer (the reversed image).

Both these silver layers were then used as a laser recording medium in a data card by laminating both sides of the above material to a 100 μm polyester sheet and a 75 μm polyethylene adhesive layer (warm lamination using a standard contact-roller laminator). In summary, the final material had the structure indicated as Ex.1 in Table 1.

TABLE 1

| Constituting layers of Ex.1 | Ex.2 | Ex.3 |
|---|---|---|
| 100 μm polyester (protecting foil) | = | = |
| 75 μm polyethylene (adhesive layer) | = | = |
| X | X | glass |
| 175 μm polyester (support) | = | = |
| reflective base layer | = | = |
| chemically developed silver layer | = | = |
| physically developed silver layer | = | = |
| X | glass | glass |
| 75 μm polyethylene (adhesive layer) | = | = |
| 100 μm polyester (protecting foil) | = | = |

"X" no layer present; "=" : same layer as in Ex.1.
"glass": 70 μm borosilicate glass, type AF45, defined above.

In addition to the comparative example Ex.1, two materials Ex.2 and Ex.3 were prepared according to the present invention. As indicated by the symbol "=" in Table 1, both these materials contained the same constituting layers as Ex.1, with the proviso that Ex.2 contained one additional glass layer between the physically developed silver layer and the polyethylene adhesive layer. No additional adhesive layer was necessary because the gelatine binder of the recording medium adheres very well to the glass surface when moistened with water followed by warm laminating. Ex.3 contained the same layers as Ex.2 with the proviso that a second glass layer was present at the opposite side of the support, as indicated in Table 1.

The materials were exposed to a Nd:YAG laser (1064 nm) in steps of increasing power of 50, 150, 250, 350 and 450 mW and a scan speed of 2 m/sec. The comparative material Ex.1 showed a gradual differentiation between exposed an unexposed areas, i.e. the physically developed silver layer as well as the chemically developed silver layer were rendered more transparent. The titanium dioxide containing base layer reflects incident light back to the reader, thereby enhancing the visible contrast.

The density difference (ΔD) between D(+), the reflective density of an unexposed area, and D(−), the reflective density of an area which was exposed to the Nd:YAG laser at a power of 450 mW, was used as an indication of the speed of these materials. Surprisingly, the materials of Ex.2 and Ex.3 were characterised by a higher ΔD value than the material of Ex.1 (values given in the fourth column of Table 2). So the glass layer somehow caused an increase of the visible contrast upon exposure. Though this effect is difficult to explain, it was very reproducible.

Moreover, a significantly increased shelf-life of the materials according to the present invention could be observed by comparing the ΔD value of fresh material with the ΔD value of artificially aged material. The ΔD values in Table 2 indicate that the shelf-life of the unexposed as well as the exposed laser recording medium is significantly increased by the presence of the glass layer(s).

TABLE 2

| Sample | no aging | | | first aging (*), then exposure | | | first exposure, then aging (*) | | |
|---|---|---|---|---|---|---|---|---|---|
|  | D(−) | D(+) | ΔD | D(−) | D(+) | ΔD | D(−) | D(+) | ΔD |
| Ex.1 | 2.59 | 3.15 | 0.56 | 2.62 | 2.92 | 0.30 | 2.59 | 2.96 | 0.37 |
| Ex.2 | 2.23 | 3.16 | 0.93 | 2.20 | 3.01 | 0.81 | 2.14 | 3.04 | 0.90 |
| Ex.3 | 2.20 | 3.15 | 0.95 | 2.21 | 3.07 | 0.86 | 2.16 | 3.10 | 0.94 |

(*) storage during 1 week at 67° C. and 50% relative humidity.

What is claimed is:

1. A data card comprising a laminate of a support, a heat-mode laser recording medium, an adhesive layer and a glass layer, wherein the glass layer has a thickness of less than 850 μm.

2. A data card according to claim 1 wherein the glass layer has a thickness of less than 500 μm.

3. A data card according to claim 1 wherein the glass layer has a thickness of less than 200 μm.

4. A data card according to claim 1 wherein the glass layer is a borosilicate glass layer.

5. A data card according to claim 1 wherein the support is a plastic foil.

6. A data card according to claim 1 wherein the laser recording medium is a metallic layer of which the optical reflectivity or density can be changed by heat-mode exposure.

7. A data card according to claim 6 wherein the metallic layer essentially consists of silver, selenium, tin or bismuth.

8. A data card according to claim 1 comprising two glass layers at opposite sides of the heat-mode laser recording medium, each said glass layers having a thickness of less than 850 μm.

9. A data card comprising a support, a heat mode laser recording medium and a borosilicate glass layer having a thickness of less than 850 μm.

10. A data card comprising a support, a heat mode laser recording medium and on each side of said heat mode laser recording medium a glass layer each glass layer having a thickness of less than 850 μm.

* * * * *